March 31, 1970 V. J. CARTER 3,504,238
SOLDER FREE VARIABLE PRESSURE CONTACTED SEMICONDUCTOR DEVICE
Filed Oct. 19, 1967
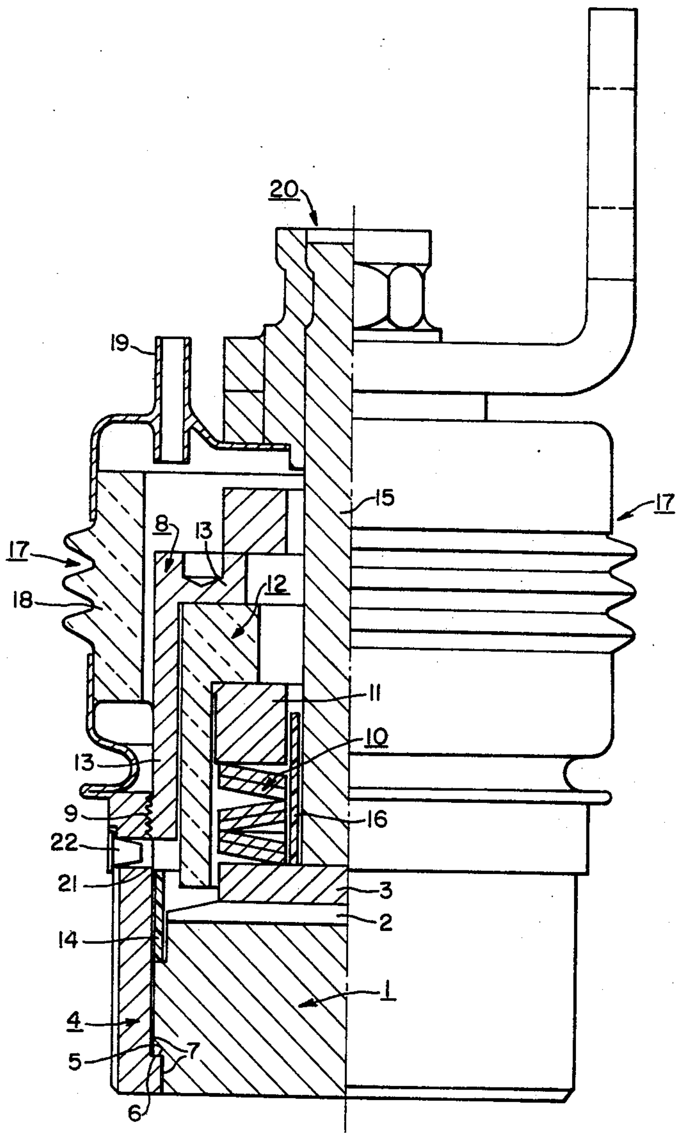

United States Patent Office 3,504,238
Patented Mar. 31, 1970

3,504,238
SOLDER FREE VARIABLE PRESSURE CONTACTED SEMICONDUCTOR DEVICE

Victor J. Carter, London, England, assignor to Westinghouse Brake English Electric Semi-Conductors Limited, London, England, a corporation of Great Britain

Filed Oct. 19, 1967, Ser. No. 676,459
Claims priority, application Great Britain, Dec. 16, 1966, 56,381/66
Int. Cl. H01l *3/00, 5/00, 9/00*
U.S. Cl. 317—234 3 Claims

ABSTRACT OF THE DISCLOSURE

This invention is concerned with a semiconductor device in which a semiconductor element is held in electrical and thermal contact with electrical contacts solely by the use of a compressive force and without any solder.

CROSS REFERENCE

This application is based on British patent application 56,381/66, filed Dec. 16, 1966 and assigned to the assignee of the present application.

BACKGROUND OF THE INVENTION

This invention relates to semiconductor devices and more particularly to such devices of the type having a semi-conductor element which is engaged with a contact of the device solely by means of the forces exerted by stressed resilient means.

Previously, the semiconductor element has been joined to its immediate electrical and thermal contacts by solder. Electrical leads are then held in contact with the electrical contacts by compressive means. However, such devices while having a somewhat improved ability to withstand thermal cycling still have a tendency to fail after repeated thermal cycling at these solder joints.

An object of the present invention is to provide a semiconductor device which is free of solder and in which the semiconductor element is held in direct electrical and thermal conducting contact with the immediate electrical contacts by compressive means.

Other objects will, in part, be obvious and will, in part, appear hereinafter.

SUMMARY OF THE INVENTION

The present invention provides a semiconductor device wherein the device includes a base portion which is of material of both high heat and high electrical conductivity and on which is mounted a semiconductor element, and a member through which passes the reactive forces of a resilient means and which is joined to the base portion, the arrangement being such that all the joints are placed in compression by the resilient means.

The base portion may conveniently be of copper and the member may be of steel.

The base portion may have been formed by "coining" and may have an annular shoulder engaged by a cooperating annular shoulder on the member. The member may be brazed or soldered to the base portion in the vicinity of the cooperating shoulders.

There may be threadedly engaged with the member a further member, the degree of stressing of the resilient means being dependent upon the extent to which the two members are threadedly engaged. In this case, the resilient means may have one end thereof adjacent the semiconductor element and the other end thereof engaged with a bearer element located between that end of the semiconductor element and the further member. The bearer element may be of metal, for example, steel in which case there may be located between the bearer element and the further member an additional member of electrically insulating material for example, ceramic and this additional member may have an extension portion which shrouds the bearer element and the resilient means. The resilient means at its end adjacent the semiconductor element may engage a contact, which may be the contact above mentioned or which may be a further contact engaged by means of the resilient means with the semiconductor element. In this case, the contact engaged by the semiconductor element may have an extension which passes through the resilient means and the further means when so provided, to the outside of the device to provide an electrical connection to the element.

DESCRIPTION OF THE DRAWING

The single view is a side view, partially in cross-section, of the semiconductor device of this invention.

DESCRIPTION OF THE PREFERRED EMBODIMENT

Referring to the drawing, there is shown a semiconductor comprising a copper base contact portion 1 on which is mounted a semiconductor element 2 of for example silicon on top of which is an electrical and thermal contact 3.

Enclosing the base portion 1 is a steel sleeve member 4 provided with a shoulder 5 which cooperates with a shoulder 6 on the base portion 1. In the region of the cooperating shoulders 5 and 6, the sleeve member 4 is brazed to the base portion 1 as shown at 7.

At the upper end of the sleeve member 4 is a further steel member 8 which is threadedly engaged at 9 with the steel sleeve member 4.

Engaged by one end with the contact 3 is resilient means 10 constituted by a stack of Belleville washers, the upper end of which engages a steel ring-shaped bearer element 11 arranged between the resilient means 10 and an additional member 12 of electrically insulating material, as for example a ceramic which member 12, is in turn, situated between the bearer element 11 and the inwardly projecting flange 13 of the member 8. The member 12 has a downwardly projecting sleeve extension 13 which shrouds the bearer element 11, the resilient means 10, and a portion of the contact 3.

Arranged between the member 4 and the base portion 1 is a sleeve 14 of electrically insulating material which prevents the semiconductor element 2 shifting sideways to engage the member 4.

The contact 3 has an extension rod 15 which passes through the resilient means 10, the bearer element 11, the member 12, and the member 8, to the outside of the device so as to provide electrical connection to the contact 3. At its lower end, the extension 15 is surrounded by a further sleeve 16 by which the extension is located centrally within the resilient means 10 and the bearer element 11.

A cap portion 17, including an insulating section 18, encloses the interior parts of the device in the normal manner. The portion 17 being secured to the member 4 and being provided, in the normal way, with a "pump-out" connection 19, which is sealed after the exhaustion and/or gas filling of the device, and with a connector arrangement 20 connected to the extension 15.

In view of the complexity of the interior of the device, a further "pump-out" connection is provided by the bore 21 which after the exhaustion and/or gas-filling of the device, is sealed by a plug 22.

From the construction, it is obvious that by stressing the resilient means 10, the lower face of the contact 3 will be forced into electrical engagement with the upper face of the semiconductor element 2 and the lower face of the semiconductor element 2 will be forced into electrical engagement with the base portion 1 which will then constitute the other contact of the device. The degree of stressing of the resilient means will be determined by the extent to which the member 8 is screwed into the member 4.

The reactive forces arising from the stressing of the resilient means 10 will pass, in one direction, through the bearer 11, the insulating member 12, the further member 8, and the member 4 to exert an upward force through the shoulder 5 of the member 4. In the other direction, the forces exerted by the stressed resilient means 10 will pass through the contact 3, the semiconductor element 2, and the base portion 1 to exert a downwardly corrected force through the shoulder 6 of the base portion 1. Hence, it will be seen, the joint between the base portion 1 and the member 4 (in the region of the cooperating shoulders 5 and 6) will be held in compression by the resilient means 10.

While the invention has been described with reference to particular embodiments it will be understood, of course, that modifications, substitutions and the like may be made without departing from its scope.

I claim as my invention:

1. A semiconductor device consisting of a semiconductor element hermetically sealed within case, said case being comprised of a base portion, a cap portion and a side portion, said semiconductor element having flat, parallel top and bottom surfaces, a first electrical contact having a flat portion and a rod portion, the flat portion having a top surface and a bottom surface, the bottom surface of the flat portion of said first contact being disposed on the top surface of the semiconductor element and in direct physical contact with the surface of the element, the rod portion of said first electrical contact extending vertically from the top surface of said flat portion through the cap portion of the case, the base portion of the case comprising a second electrical contact for the semiconductor element, said second contact being in direct physical contact with the bottom surface of said semiconductor element, and variable resilient compressive means disposed about the rod portion of the first electrical contact within the hermetically sealed case and exerting a compressive force against the top surface of the flat portion of the first electrical contact, said resilient compressive means forcing said semiconductor element and said flat portion of said first contact and said second contact in an electrical conductive relationship.

2. The device of claim 1 in which the side portion of the case includes a threaded portion for varying the compressive force.

3. The device of claim 1 in which the resilient compressive means consists of a plurality of spring washers.

References Cited

UNITED STATES PATENTS

| | | | |
|---|---|---|---|
| 3,030,558 | 4/1962 | Berg et al. | 317—234 |
| 3,059,157 | 10/1962 | English et al. | 317—234 |
| 3,259,060 | 5/1966 | Marino et al. | 317—234 |
| 3,293,508 | 12/1966 | Boyer | 317—234 |
| 3,293,510 | 12/1966 | Pfaffenberger et al. | 317—235 |
| 3,313,987 | 4/1967 | Boyer | 317—234 |
| 3,333,163 | 7/1967 | Wislocky | 317—234 |
| 3,337,781 | 8/1967 | Ferree | 317—234 |
| 3,328,650 | 6/1967 | Boyer | 317—234 |

FOREIGN PATENTS

| | | |
|---|---|---|
| 289,633 | 6/1965 | Netherlands. |
| 1,381,184 | 10/1964 | France. |
| 1,454,930 | 8/1966 | France. |

JOHN W. HUCKERT, Primary Examiner

R. F. POLISSACK, Assistant Examiner

U.S. Cl. X.R.

317—235